INVENTOR
ELDEN R. DAVISSON
BY
Trask Jenkins & Hanley
ATTORNEYS

ELECTRONIC SHUT-OFF TIMERS

Filed March 18, 1968 2 Sheets-Sheet 2

INVENTOR
ELDEN R. DAVISSON
BY
Trask Jenkins & Hanley
ATTORNEYS 3,559,072
ELECTRONIC SHUT-OFF TIMERS
Elden R. Davisson, Columbus, Ind., assignor to Arvin Industries, Inc., Columbus, Ind., a corporation of Indiana
Filed Mar. 18, 1968, Ser. No. 713,614
Int. Cl. H03k *17/28;* H04b *1/16*
U.S. Cl. 325—395 2 Claims

ABSTRACT OF THE DISCLOSURE

Electronic switches controlled by RC timing circuits for combination with a radio or the like to provide timed play periods of the radio. In one embodiment the switch comprises a semiconductor having its principal conducting elements connected in series with the low voltage receiver stages and low voltage power supply of a radio. An RC timing circuit is coupled to the control electrode of the semi-conductor to turn it off after a timed interval from its turn on time. In a second embodiment the electronic switch comprises a semiconductor having its principal conducting electrodes coupled between the low voltage power supply and the audio input to the volume control potentiometer of the receiver. Again, an RC timing circuit is coupled to control conduction of the semiconductor which shorts out the audio signal after a timed interval.

BACKGROUND OF THE INVENTION

Radios which include automatic turn-off circuitry are well known in the prior art. However, such radios are generally of the clock-radio type and rely on the clock for their timed play cycle. It is an object of this invention to provide electronic timing circuits for use in turning a device "on" for a timed interval and then automatically turning it "off."

SUMMARY OF THE INVENTION

In accordance with the invention I provide a first embodiment of an electronic switch comprising a series combination of a load, a semiconductor, and a D.C. source of power for the load. The semiconductor functions as a switch and allows load current to flow when the semiconductor is biased into a conductive state. Similarly, no load current can flow when the semiconductor is cut-off. An RC timing circuit is coupled to the control electrode of the semiconductor to switch it into a conductive state for a timed interval, after which it is switched to its cut-off state. The semiconductor is a field effect transistor (FET) having its drain electrode connected to the positive terminal of the power source, and having its source electrode connected to the load. The timing circuit comprises a capacitor connected between the gate and source leads of the FET and a resistor connected from the gate to the negative terminal of the voltage source. A manual, or manually operable, switch is connected in parallel with the capacitor and the gate-to-source junction, so that when it is closed the potential between the gate and source electrodes of the FET is zero and the FET conducts to provide a continuous "on" condition for the load. If the manual switch is depressed and released, the capacitor is discharged and then begins to charge through the resistor. The load remains in the "on" condition until the capacitor charges to the potential which biases the FET into cut-off, thereby turning off the load.

In a modification of this first embodiment the semiconductor comprises a silicon controlled rectifier (SCR) having its anode connected to the positive terminal of the power source and having its cathode connected to the load. A series combination of a push-button and a resistor is connected between the gate electrode of the SCR and the anode to provide a means for switching the SCR into conduction. An RC timing circuit is connected to a unijunction transistor (UJT) to supply a pulse to the cathode of the SCR to terminate its conduction after the timed interval. The capacitor of the timing circuit is connected to the emitter of the UJT, and when it charges up to the peak emitter voltage of the UJT the latter suddenly conducts through a resistor causing a pulse which it coupled to the cathode of the SCR, thereby switching the SCR into cut-off condition.

Another modification of said first embodiment provides an NPN switching transistor in series with the power source and load. The positive terminal of the power source is connected to the load, and the return lead of the load is connected through the collector and emitter of the transistor to the negative terminal of the power source. The bias voltage at the base of the transistor is controlled by an FET having its drain electrode coupled to the base of the switching transistor and through a resistor to the positive terminal of the voltage source. The source electrode of the FET is connected to the negative terminal of the voltage source, and its gate is connected to the RC timing circuit. A three position switch controls the timing circuit, and in its first position it provides a short between the return lead of the load and the negative terminal of the voltage source. In its second position the switch couples a positive potential to the gate of the FET through a voltage divider circuit from the voltage source so that the FET conducts thereby biasing the switching transistor into its cut-off state. The switch, in the second position, also charges the timing capacitor. When the switch is in its third position, the timing capacitor is coupled in parallel with the timing resistor and applies a negative potential to the gate lead of the FET so that it is turned off thereby biasing the switching transistor into a conducting condition and turning on the load. As the timing capacitor discharges through the timing resistor a potential is reached where the FET is turned on thereby biasing the switching transistor into cut-off to turn off the load. Again, the timing circuit in this modification turns the load on for a timed interval and subsequently turns it off.

A second embodiment of my invention comprises an electronic switch specifically for use in turning on a radio for a timed interval and then turning it off. In this embodiment the semiconductor comprises a PNP transistor connected through a two position switch to the audio input of the volume control potentiometer of a radio. In one position of the switch a capacitor is charged through a voltage divider circuit from the low voltage power supply of the radio, and the contacts coupling the semiconductor to the radio are open so that the timing circuit does not affect the operation of the radio. When the switch is thrown to its second position the capacitor is placed in parallel with the timing resistor and the negative lead of the charged capacitor is connected to the gate of a field effect transistor. The drain electrode of the FET is connected to the base of the semiconductor, and the source electrode is connected to the negative terminal of the low voltage supply. Thus, when the switch is in its first position the radio may operate normally, but when the switch is thrown to its second position the radio will operate for a timed interval while the capacitor discharges through the timing resistor. When the potential at the gate of the FET decreases sufficiently, it begins conducting, thereby turning on the PNP transistor to apply the supply voltage to the volume control of the radio. This effectively shorts the audio signal to ground through the power supply, and turns off the radio.

BRIEF DESCRIPTION OF THE DRAWINGS

The accompanying drawings illustrate the invention. In such drawings.

DETAILED DESCRIPTION OF THE PREFERRED EMBODIMENTS

Figure 1:
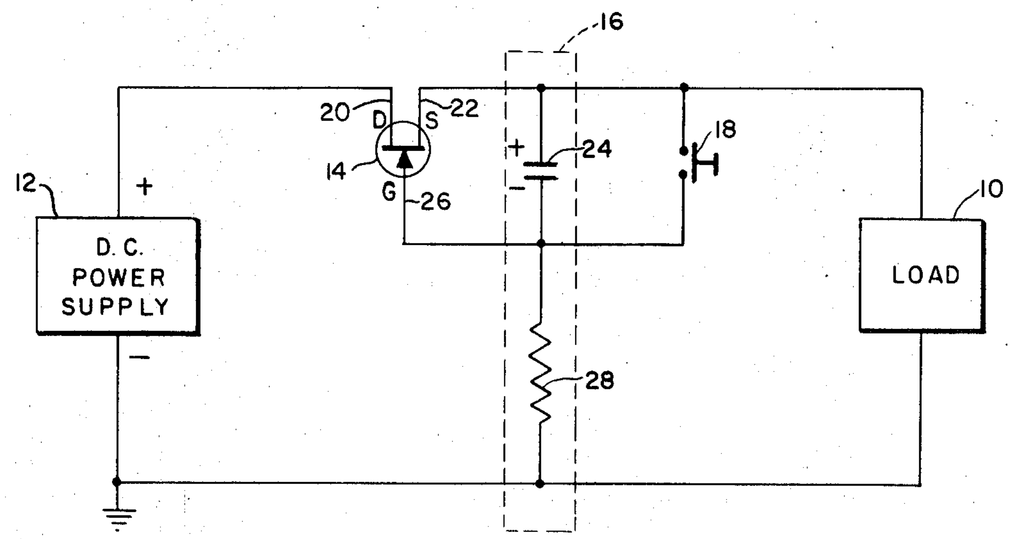
FIG. 1 is a schematic diagram of an automatic shut-off timer embodying my invention.

In one embodiment of my invention, as shown schematically in FIG. 1, I provide an electronic switch connected in series between a load 10 and a D.C. power supply 12. The electronic switch comprises a field effect transistor 14 controlled between its cut-off and conducting states by an RC timing circuit 16 and a push-button switch 18. The drain 20 and source 22 electrodes of the FET 14 are connected respectively to the positive terminal of the power supply 12 and to the load 10. A capacitor 24 of the RC circuit 16 is connected between the source and gate electrodes 22 and 26; and the gate 26 is also coupled through a resistor 28 of the RC circuit to the negative terminal of the power supply. The push-button switch 18 is connected in parallel with the capacitor 24 to complete the circuit.

An N-channel FET is fully conductive when its gate-to-source potential is zero or positive. Thus, in the circuit of FIG. 1, current can flow from the power-supply to the load whenever the push-button switch 18 is depressed since the switch 18 will then provide a short circuit between the gate and source electrodes 26 and 22 ensuring that the potential therebetween will be zero. Upon release of the push-button switch 18, the timing capacitor 24 begins to charge through the timing resistor 28 thereby establishing an increasingly negative gate-to-source potential which causes the voltage at the drain electrode 20 to decay below a usable level.

Therefore, if the load 10 consists of the low voltage stages of a radio receiver, and the power supply 12 consists of the receiver's low voltage D.C. source, then the electronic switch 14, RC circuit 16, and push-button switch 18 combine to provide a timed interval of play for the radio. The radio begins to play when the push-button is pressed, and it continues to play for a timed interval after the push-button is released, gradually fading out during the timed interval. The duration of the timed interval depends on the values of the capacitor, the resistor, and the input impedance of the FET since these values determine the charging rate of the capacitor.

Figure 2:
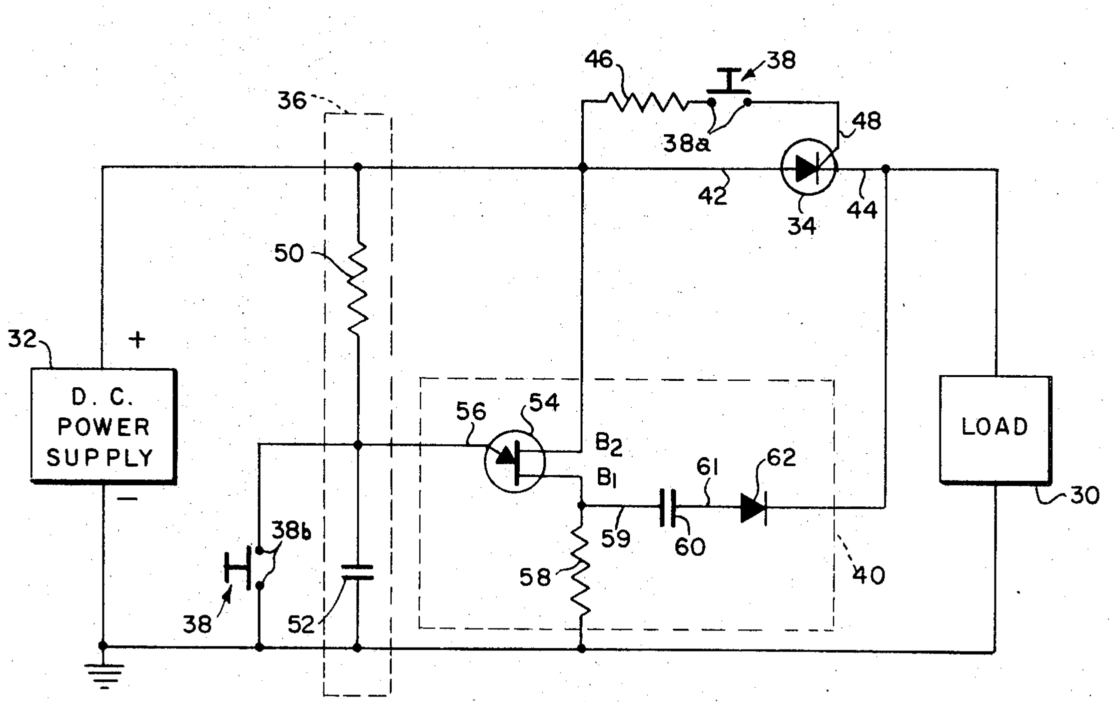
FIG. 2 is a modification of the embodiment shown in FIG. 1.

As shown schematically in FIG. 2, a modification of the first embodiment also provides an electronic switch connected in series between a load 30 and a D.C. power supply 32. The electronic switch comprises a silicon-controlled-rectifier 34 switched between its conductive and cut-off states by an RC timing circuit 36, a push-button switch 38, and a pulse circuit 40. The anode 42 of the SCR 34 is connected to the positive terminal of the power supply, while the cathode 44 is connected to the load. One set of contacts 38*a* of the push-button switch 38 is connected in series with a current limiting resistor 46 and the combination is coupled across the gate and anode leads 48 and 42 of the SCR 34 to provide a means for turning the SCR on. That is, by depressing the push-button switch 38 a positive voltage is coupled from the power supply to the gate of the SCR, thereby switching it into a conductive state. The resistor 46 protects the SCR 34 against the excessive current flow from the power supply to the gate 48. The timing circuit 36, comprising a resistor 50 and capacitor 52, charges to a point where it reaches the peak emitter voltage of a unijunction-transistor 54 causing the UJT to suddenly enter its conductive state, thereby creating a positive pulse which is coupled to the cathode of the SCR 34 to turn the SCR off. The timing resistor 50 is connected to the positive terminal of the power supply, and the timing capacitor 52 is connected from the other side of the resistor 50 to the negative terminal of the power supply. The emitter 56 of the UJT 54 is coupled to the capacitor 52, and the UJT's $B_2$ and $B_1$ electrodes are connected respectively to the positive terminal of the power supply and to one side of a load resistor 58. The other side of the load resistor is connected to the negative terminal of the power supply, and therefore the supply voltage is dropped across the load resistor 58 when the UJT 54 is in its fully conductive state. One lead 59 of a coupling capacitor 60 is connected to the $B_1$ lead of the UJT, and the other coupling capacitor lead 61 is connected to the anode of an isolating diode 62. The cathode of the diode is connected to the cathode 44 of the SCR to turn the SCR off when a positive voltage is present at the $B_1$ electrode of the UJT. Contacts 38*b* of the push-button switch 38 are connected across the timing capacitor 52 to provide a path for current around the timing capacitor when the push-button switch is depressed.

In the operation of this modification, the SCR is turned on when the push-button switch 38 is depressed, thereby connecting the positive voltage from the supply 32 to the gate of the SCR through the current limiting resistor 46. While the push-button switch 38 remains closed, said positive voltage is continuously applied to the SCR gate 48 and no current can flow through the UJT 54 since the timing capacitor is bypassed and the UJT's emitter lead is at the same potential as its $B_1$ lead. However, when the switch 38 is released, the current flowing through the timing resistor 50 charges the timing capacitor 52 until it reaches a positive voltage equal to the peak point emitter voltage of the UJT thereby turning on the UJT and causing it to conduct through its $B_2$ and $B_1$ leads to the load resistor 58. The initial surge of current through the UJT 54 appears as a step function at its $B_1$ lead and this step function is coupled through the capacitor 60 and diode 62 as a pulse to raise the cathode potential of the SCR. The circuit components are chosen so that the pulse causes the SCR current to decrease below its holding level, so that the SCR 34 is biased off thereby turning off the current to the load 30. Thus, the duration of the timed interval in this modification is equal to the time it takes for the timing capacitor 52 to charge up to the peak point emitter voltage of the UJT 54. This in turn is dependent upon the values of the resistor 50 and capacitor 52 in the timing circuit 36, and the input impedance at the emitter electrode 56 of the UJT 54. Once the SCR 34 has been pulsed off, it cannot conduct until push-button switch 38 is again depressed.

Figure 3:
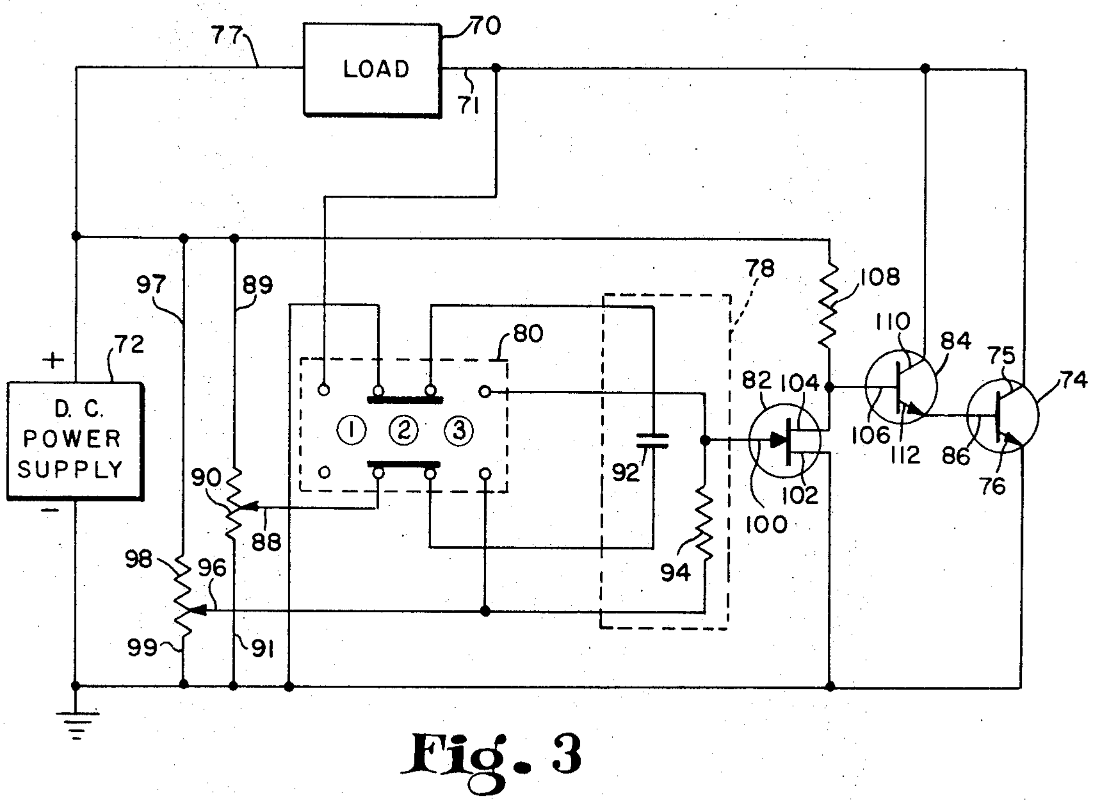
FIG. 3 is another modification of embodiment shown in FIG. 1.

As shown schematically in FIG. 3, another modification of the first embodiment also provides an electronic switch connected in series with a load 70 and D.C. power supply 32. In this modification, the electronic switch comprises a principal conducting NPN transistor 74 having its collector 75 connected to the return lead 71 of the load 70, and having its emitter 76 connected to the negative terminal or ground of the power supply 72. The positive terminal of the power supply is connected to the power input lead 77 of the load 70. Therefore, when the transistor 74 is saturated, all of the supply voltage is applied to the load 70 except for the small drop across the transistor 74.

Conduction of the transistor 74 is controlled by an RC timing circuit 78, a three position switch 80, and a field effect transistor 82 coupled through a second transistor 84 to the base 86 of the principal conducting transistor 74. The switch 80 comprises two sets of four contacts, each set having a shorting arm associated therewith for engagement with a pair of contacts. The shorting arms move together to short a first pair of adjacent contacts including one end contact in each set in a first position; the middle two contacts in each set in a second position; and the other end contact and the one adjacent thereto in each set in a third position. Said one end contact on one set is coupled to the return lead 71 of the load, and its adjacent contact is connected to ground. The corresponding end contact of the other set is left blank, and therefore, when the arms are positioned such that said one contact is shorted to its adjacent contact, the load current may flow through the switch 80. The contact adjacent the blank contact is connected to the arm 88 of a potentiometer 90 having its end leads 89 and 91 connected across the power supply 72. A capacitor 92 in the RC timing circuit 78 is connected across the remaining middle contacts of each set, and a resistor 94 of the RC timing circuit 78 is connected across the remaining end contacts of each set. One side of the resistor 94 is connected to the arm 96 of a second potentiometer 98 having its end leads 97 and 99 coupled across the power supply 72. The other side of the resistor 94 is connected to the gate 100 of the FET 82. The source 102 of the FET is connected to ground, and the drain 104 is connected to the base 106 of the second transistor 84 and through a dropping resistor 108 to the positive terminal of the power supply 72. The collector 110 and emitter 112 of the transistor 84 are connected respectively to the collector 75 and base 86 of the principal conducting transistor 74.

In the operation of this modification, when the switch 80 is in its first position, the return lead 71 for the load 70 is coupled through the switch 80 to ground, and all of the load current flows through the switch 80. During this state of operation, the FET 82 is biased into conduction as determined by its gate potential from the timing resistor 94 and the potentiometer 98. As the FET 82 conducts, it couples the base 106 of the second transistor 84 to ground thereby preventing current flow in either transistor 74 or 84. When the switch 80 is moved to its second position, so that the middle pair of contacts of each set are connected by the shorting arms, the FET 32 remains on, and therefore the transistors 74 and 84 remain biased off so that no current flows through the load. In said second position of the switch 80, the timing capacitor 92 is charged through the potentiometer 90 and the switch 80 to ground. Thus, the circuit functions only to charge the timing capacitor 92. When the switch 80 is moved to its third position, the timing capacitor 92 and resistor 94 are connected in parallel and the negative lead of the charged capacitor 92 is connected to the gate 100 of the FET 82. Therefore, the FET is biased off and the current flows through the dropping resistor 108 and through transistor 84 to turn on the principal conducting transistor 74. The transistors 74 and 84 continue to conduct while the FET is biased off, and the gain of transistor 84 insures that sufficient base current is supplied to transistor 74 to maintain the latter in a saturated state where all but a small portion of the power supply voltage is applied across the load 70. As the timing capacitor 92 discharges through the resistor 94, it reaches a voltage where the FET 82 begins to conduct, thereby connecting the base 106 of the second transistor 84 to ground and turning off both transistors 74 and 84. A timed interval of play is thus provided having a duration determined by the time constant of the RC circuit 78, the bias voltage from potentiometer 98, and the fully charged voltage of the capacitor 92 as controlled by the voltage at the arm 88 of potentiometer 90. Thus, the three positions of the switch 80 provide an "on" condition in the first position, an "off" condition in the second position where the timing capacitor 92 is charged, and a timed interval of operation in the third position as the capacitor 92 discharges.

For ease of description, these modifications have been described as useful for combination with radio receivers. It is to be understood, however, that said modifications are useful as electronic switches for any direct current load.

Figure 4:
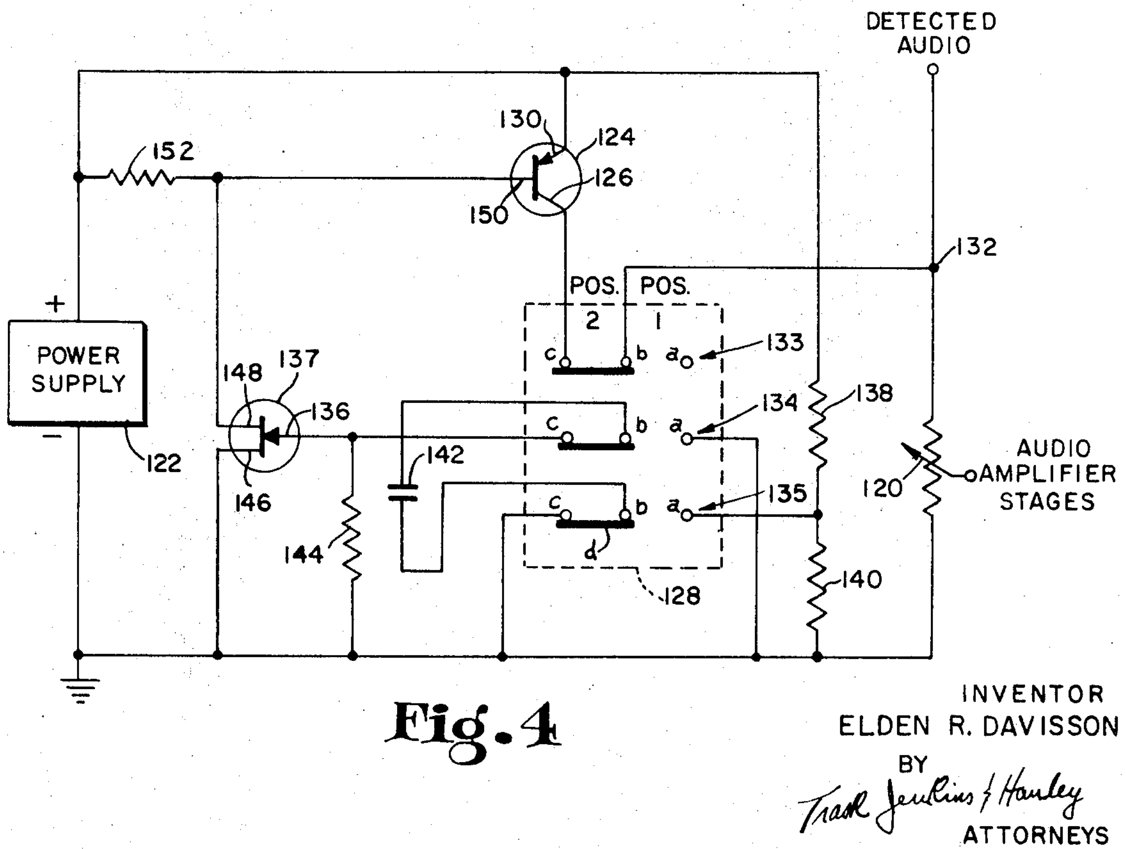
FIG. 4 is a schematic diagram of a second embodiment of my invention.

In a second embodiment of my invention, as shown schematically in FIG. 4, I provide an electronic switch for use with a radio receiver, wherein the switch couples the detected audio signal at the receiver's volume control potentiometer 120 to ground through a power supply 122. The electronic switch comprises a PNP transistor 124 having its collector 126 connected to a two position switch 128. The emitter 130 of the transistor 124 is connected to the positive terminal of the power supply 122, and in one position of the switch 128 the collector 126 is connected to the volume control potentiometer 120 at its audio input 132.

The switch 128 has three sets of contacts 133, 134, and 135 each set having two end contacts *a* and *c* and a middle contact *b*. Each set of contacts is provided with a movable shorting arm *d* which slides between the two positions of the switch 128. In the first set of contacts 133 on the switch 128 the end contact 133*a* corresponding to the first position of the switch is left blank; the other end contact 133*c* is connected to the collector 126; and the middle contact 133*b* is connected to the audio input 132. In the second set of contacts 134 the first position end contact 134*a* is grounded, while the other end contact 134*c* is connected to the gate 136 of a field effect transistor 137. In the third set of contacts 135 the second position end contact 135*c* is grounded, and the first position end contact 135*a* is connected to the junction of two resistors 138 and 140 having their other ends connected across the power supply 122 to form a voltage divider. A timing capacitor 142 is connected across the middle contacts 134*b* and 135*b* of the second and third sets of contacts, and a timing resistor 144 is connected from the gate 136 of the FET 137 to ground. The source 146 of the FET 137 is grounded, and the drain 148 is connected to the base 150 of the transistor 124, and through a dropping resistor 152 to the positive terminal of the power supply 122.

In the operation of this circuit, with the switch 128 in its first position, the radio receiver is not affected by the electronic switch 124 since the connection from the audio input 132 is left open by the first set of contacts 133 on the switch 128. However, the timing capacitor 142 is charged through the divider resistors 138 and 140 and the second and third set of contacts 134 and 135 on the switch 128. In the second position of the switch 128, the capacitor 142 applies a negative voltage to the FET 137 thereby preventing its conduction and preventing conduction of the transistor 124. As the capacitor 142 discharges through the timing resistor 144, the FET begins to conduct thereby biasing the base of transistor 124 to a potential sufficient to cause the transistor to conduct in a saturated condition. Since, in the second position of the switch 128, the transistor collector 126 is connected to the audio input 132, the audio signal is shorted to ground through the transistor 124 and the power supply 122. Therefore, in this second embodiment the electronic switch provides a timed interval of play for a radio receiver, or other electronic device wherein a signal can be shorted to ground, as determined by the time constant of the timing resistor 144 and the timing capacitor 142.

I claim:

1. An electronic switch and a timing circuit for controlling said switch, comprising a semiconductor having principal conducting electrodes and a control electrode, and having conductive and nonconductive states of operation, said principal conducting electrodes being adapted for series connection between a power supply and a load, an RC timing circuit having a resistor and a capacitor connected together and coupled to said semiconductor for controlling said semiconductor to switch from one of said states of operation to the other after a timed interval determined by the time-constant of the resistor and capacitor, a manual switch connected in parallel with said capacitor, said capacitor being connected between the control electrode and one of the principal conducting electrodes of said semiconductor, and said resistor being adapted for connection between said control electrode and the common point between the load and power supply, said manual switch being selectively closed to bias said semiconductor into its conductive state, thereby closing the electronic switch and being opened to allow the capacitor to charge through the resistor to bias the semiconductor into its nonconductive state thereby reopening the electronic switch.

2. The invention as set forth in claim 1 in which said semiconductor is a field effect transistor having drain, source and gate electrodes, the drain electrode being adapted for connection to the positive terminal of the power supply, and the capacitor being connected from the gate to the source electrode, whereby closing said manual switch shorts out the capacitor and biases the field effect transistor into conduction thereby allowing load current to flow, whereupon opening of the manual switch allows the capacitor to charge and decrease current flow through the field effect transistor.

References Cited

UNITED STATES PATENTS

| | | | |
|---|---|---|---|
| 2,976,487 | 3/1961 | Cohen | 328—129 |
| 3,158,790 | 11/1964 | Garratt | 328—129 |
| 3,414,735 | 12/1968 | Harris | 328—129 |
| 3,424,865 | 1/1969 | Marchand | 325—395 |
| 3,467,834 | 9/1969 | Coleman | 307—293 |

ROBERT L. GRIFFIN, Primary Examiner

H. W. BRITTON, Assistant Examiner

U.S. Cl. X.R.

307—293; 328—129